US011783803B2

(12) United States Patent
Heisler

(10) Patent No.: US 11,783,803 B2
(45) Date of Patent: Oct. 10, 2023

(54) ELECTRONIC TOUCH CAPACITANCE SWITCH FOR MUSICAL INSTRUMENT

(71) Applicant: Edward Charles Heisler, Cave Creek, AZ (US)

(72) Inventor: Edward Charles Heisler, Cave Creek, AZ (US)

( * ) Notice: Subject to any disclaimer, the term of this patent is extended or adjusted under 35 U.S.C. 154(b) by 336 days.

(21) Appl. No.: 17/247,939

(22) Filed: Dec. 31, 2020

(65) Prior Publication Data

US 2021/0304715 A1    Sep. 30, 2021

Related U.S. Application Data

(60) Provisional application No. 62/956,296, filed on Jan. 1, 2020.

(51) Int. Cl.
*G10H 1/34* (2006.01)
*G10H 3/18* (2006.01)
(Continued)

(52) U.S. Cl.
CPC ............. *G10H 1/34* (2013.01); *G06F 3/044* (2013.01); *G10H 1/0008* (2013.01);
(Continued)

(58) Field of Classification Search
CPC .... G10H 3/186; G10H 1/34; H01H 2239/006; H01H 17/62; H01H 2217/09607
See application file for complete search history.

(56) References Cited

U.S. PATENT DOCUMENTS

| 2007/0180976 A1* | 8/2007 | Demsey | G10H 1/40 |
| | | | 84/315 |
| 2013/0162417 A1* | 6/2013 | Chu | H03K 17/962 |
| | | | 340/407.2 |

(Continued)

FOREIGN PATENT DOCUMENTS

DE    102010017697 A1 *  1/2012  ............. G10D 1/085

*Primary Examiner* — Daniel J Colilla
(74) *Attorney, Agent, or Firm* — Wright Law Group, PLLC; Mark F. Wright

(57) ABSTRACT

An electronic switch for the upgrade of an electric stringed instrument for enhancing the musical or artistic performance of a user. The electronic switch has two parts. The first part consisting of a printed circuit board with terminals for wire connections. On the printed circuit board are solid state relays and other electronic components. They are electronically controlled by the second part that is an external user-controlled switch. The switch is an LED touch capacitance switch, also referred as but not limited to, a capacitance touch switch, or touch key. The capacitance touch switch has an LED light that changes colors from either a blue or green to red, but not limited to, indicating when the electronic switch is activated. When the LED touch capacitance switch activates the electronic switch board, the electronic switch board reroutes multiple signals that are attached to its terminal connectors. The electronic switch allows the user to route multiple signals at once with one touch of the LED touch capacitance switch. The LED touch capacitance switch consisting of an LED light that changes colors from either a blue or green to red, but not limited to, when touched allows the user to know the status of the electronic switch. Both parts of the electronic switch obtain power from some type of battery or super capacitor power source, but not limited to.

6 Claims, 6 Drawing Sheets

(51) Int. Cl.
*H05K 1/18* (2006.01)
*G10H 1/18* (2006.01)
*G06F 3/044* (2006.01)
*G10H 1/00* (2006.01)

(52) U.S. Cl.
CPC .............. *G10H 3/186* (2013.01); *H05K 1/18* (2013.01); *G10H 2220/021* (2013.01); *H01H 2219/062* (2013.01); *H01H 2239/006* (2013.01); *H05K 2201/10053* (2013.01); *H05K 2201/10106* (2013.01); *H05K 2201/10189* (2013.01)

(56) References Cited

U.S. PATENT DOCUMENTS

| | | | | |
|---|---|---|---|---|
| 2014/0150630 | A1* | 6/2014 | Juszkiewicz | G10H 1/02 84/626 |
| 2017/0098437 | A1* | 4/2017 | Brzykcy | G10H 3/186 |

* cited by examiner

ELECTRONIC TOUCH CAPACITANCE SWITCH FOR MUSICAL INSTRUMENT

BACKGROUND

The embodiments herein relate generally to electric stringed instruments. More specifically, embodiments of the invention relate to electric and bass guitars for enhancing a user's musical performance. Electric stringed instruments such as the electric guitar, bass guitar, and acoustic electric guitar, but not limited to, comprise a variety of components including a body, neck, strings, bridge, one or more pickups and the internal electronics needed for the guitar to produce a signal to be amplified. There exist basic standardized electronics in every guitar. However, these current designs for guitar electronics are limited because they adhere to a paradigm of industry standards based on vintage guitar designs. These designs are limited and were specific for the instruments of the time. Guitars today are more advance and require more options for its electronics. Having an electronic system for guitars providing multiple options allows the musician to wire their instrument to maximize its signal combinations provide the musician with more options to inspire the musician. Further, by having the LED touch capacitance switch is more visual for the musician and with the multiple options of the switch circuit board the musician can reconfigure their instrument with one touch of the LED touch capacitance switch. As such, there is a need in the industry for an electronics system for the electric guitar, bass guitar, and acoustic electric guitar, but not limited to, with the options that overcomes the limitations of the prior art. In particular, there is a need for an electronic switch for guitar electronics which enhances the musical and/or artistic performance of the user.

SUMMARY

Traditionally the signal of the guitar's pickups is routed though the guitar with one central switch to its output jack. As the guitar grew in popularity so did the desire to find every possible sound within their guitar. Through the years switch manufactures developed switches offering more combination for the guitar pickups. At the same time guitar pickup manufactures started developing pickups that could be wired in multiple combinations offering even more options for its customer. As such the combinations of sounds that can be created with guitar pickups have grown significantly. However, even with the improvements with the mechanical switches, the combinations are still limited when using one switching device.

With the Luminator Electronic Switch the guitarist can add one device that can handle multiple tasks with just one touch of its LED touch capacitance switch. The LED lighted capacitance touch switch allows the user to easily see if the Luminator Electronic Switch is activated. It is also visually appealing to instrument.

DETAILED DESCRIPTION OF CERTAIN EMBODIMENTS

Figure 1:
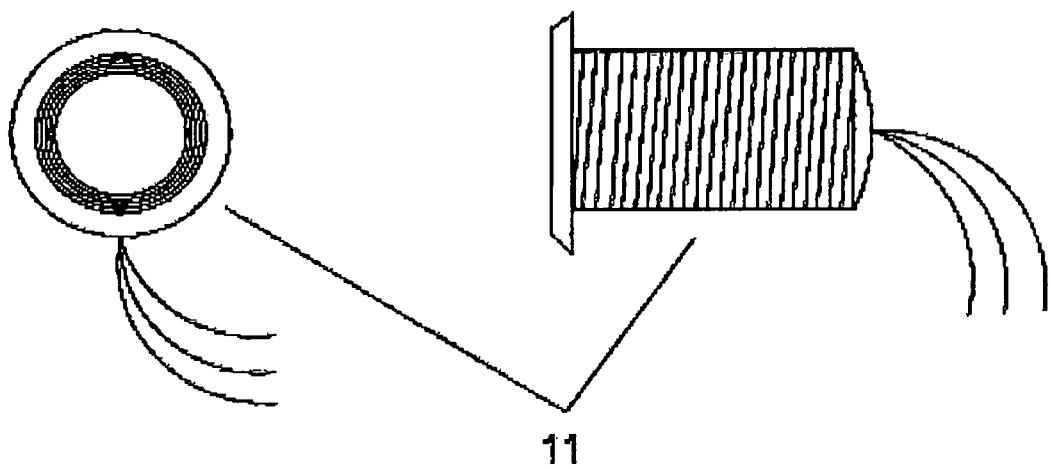
FIG. 1 depicts Luminator LED Touch Capacitance Switch with top and side views.
Figure 2:
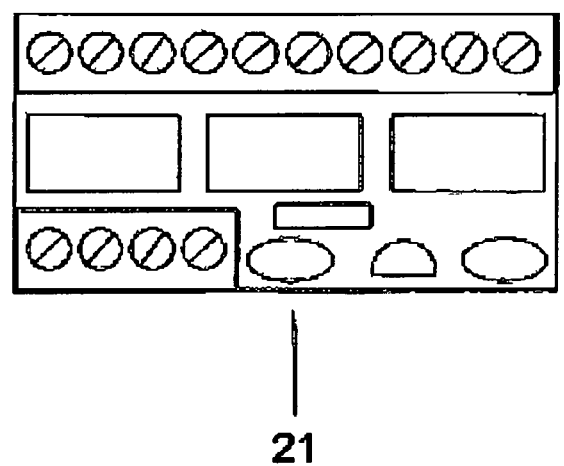
FIG. 2 depicts Luminator Switch Board

The detailed description of some embodiments of the invention will be made below with reference to the accompanying figures, wherein the figures disclose one or more embodiments of the present invention. FIG. 1 shows the top and side views of the LED touch capacitance switch. The top of the switch will be on top of the instrument in view of the musician. The side view shows the part of the switch that would fit through the instrument into the electronic control cavity. FIG. 2 shows the electronic switch board that interfaces with the instrument's electronics.

Figure 3:
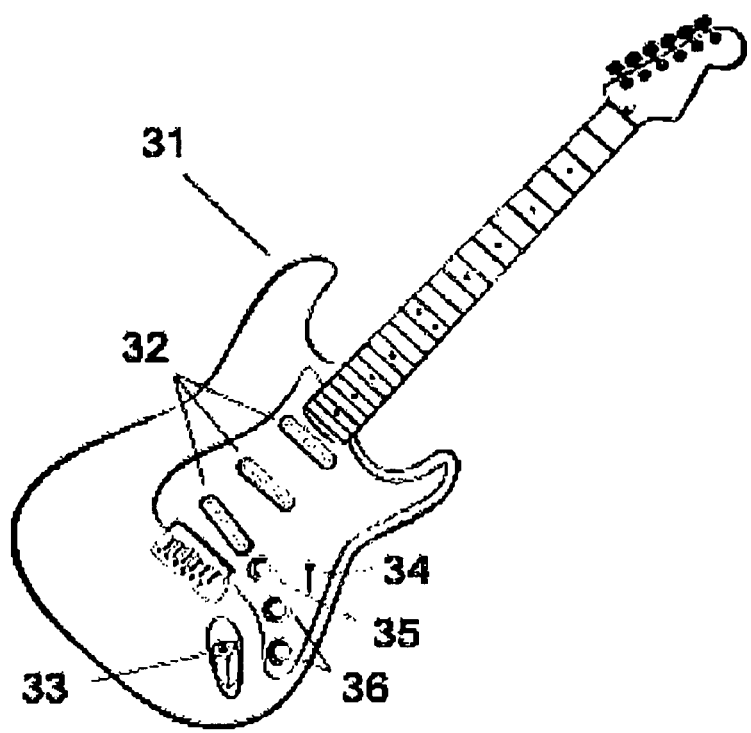
FIG. 3 depicts a prior art of a typical guitar and its controls.
Figure 4:
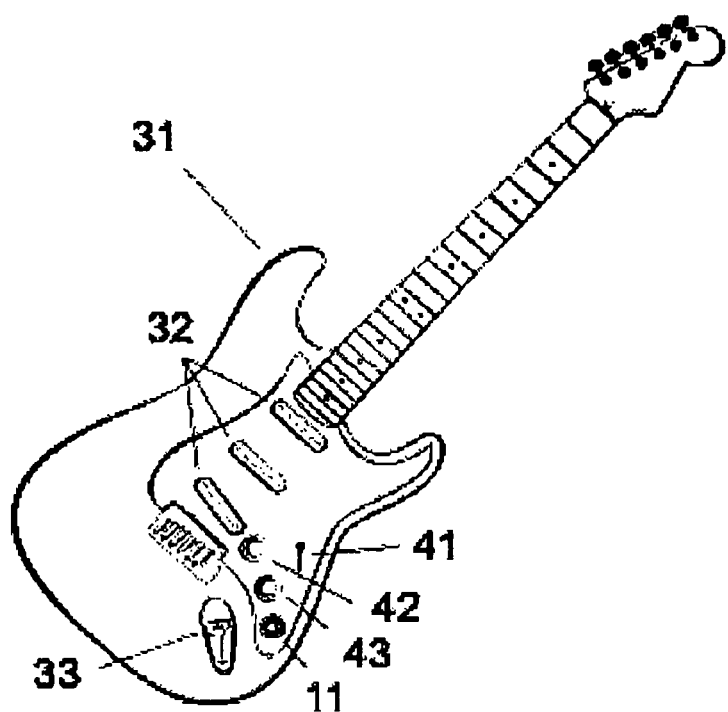
FIG. 4 depicts a view of typical guitar and its controls with a Luminator Electronic Switch system of claim on a typical guitar.

FIG. 3 depicts a prior art example of a typical guitar 31, but not limited to. It shows the pickups 32, an output jack 33, a single selector switch 34, a volume control 35, and two tone controls 36. FIG. 4 shows a typical guitar 31, its pickups 32 and an output jack 33.

It also shows the direct replacement of the selector switch with the Luminator selector switch 41, the Luminator volume 42, the Luminator tone control 43 and the Luminator Touch Capacitance Switch 11.

Figure 5:
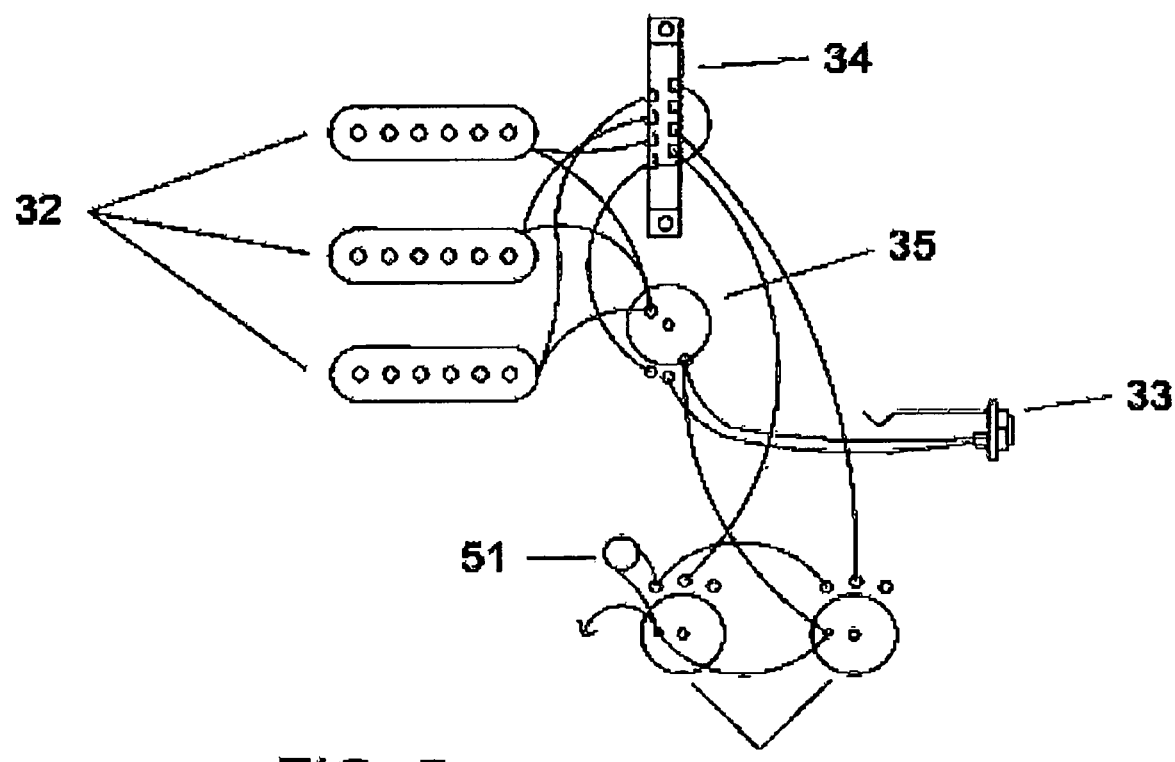
FIG. 5 depicts a prior art wiring of a typical guitar's electronics.
Figure 6:
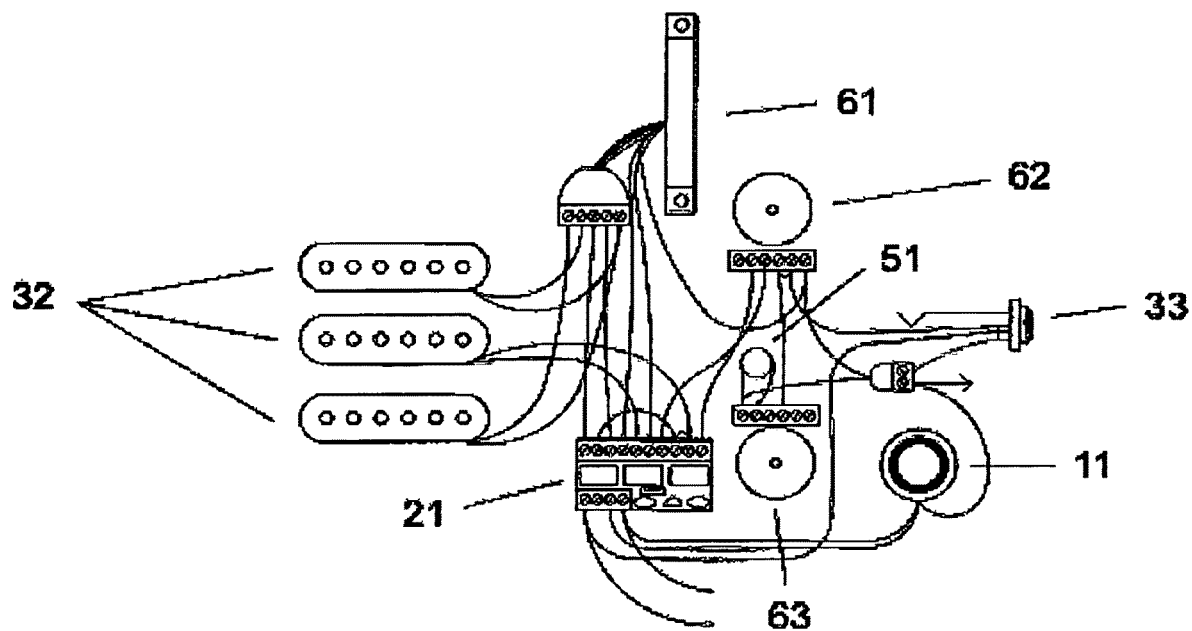
FIG. 6 depicts the upgraded wiring with the Luminator system of claim on a typical guitar.

FIG. 5 depicts the prior art as shown inside of the guitar 31. The volume potentiometer 35 and the tone potentiometers 36 have only a single value and with no options. The selector switch 34 provides three to five different pickup combinations. FIG. 6 depicts the wiring inside the guitar 31 with the Luminator installed. The dual value volume potentiometer 62 and dual value tone potentiometer 63 have terminals to allow for wires to be connected to the dual value potentiometers 22 and 23 without the need of solder. These may be screw terminals, spring-cage, or similar, but not limited and comprises of a 500k side and 250k side but not limited to. The Luminator selector switch 61 and Luminator switch board 21 have terminals to allow for wires to be connected without the need of solder. These may be screw terminals, spring-cage, or similar, but not limited to.

FIG. 6 depicts the Luminator selector switch 61. It is designed to work in conjunction with the Luminator switch board 21. The Luminator LED touch capacitance switch 11 changes the condition of the Luminator switch board 21. With the change in the condition of the Luminator switch board 21 it reconfigures the Luminator selector switch 62 to offer different pickup 32 combinations to expand the guitar's 31 tonal capabilities.

It shall be appreciated that the components of the system may be manufactured and assembled by hand or using any known machining techniques in the field. It shall be appreciated that the combination of the components will vary in number and assembly depending on configuration. In operation, the user will generally use the system for the upgrade of an electric stringed instrument for enhancing the musical or artistic performance of a user. The system is designed to upgrade a user's electric guitar without the use of a solder iron and with minimal skills. The user will have the ability to choose as an upgrade to a guitar's original electrical components, but not limited to. A manufacture may also utilize the system as a standard option on their instruments.

It shall be appreciated that the components of the system described in several embodiments herein may comprise any alternate known materials in the field and be of any color, size, resistance values, and/or dimensions. While the embodiments described herein relate to a wiring system, it shall be appreciated that embodiments of the invention may also apply to any other electric stringed instrument such as an electric guitar, acoustic guitar, bass guitar, or the like. Persons of ordinary skill in the art may appreciate that numerous design configurations may be possible to enjoy the functional benefits of the inventive systems. Thus, given the wide variety of configurations and arrangements of embodiments of the present invention the scope of the invention is reflected by the breadth of the claims below rather than narrowed by the embodiments described above.

What is claimed is:

1. A musical instrument, the musical instrument comprising:
   a switch board;
   a selector switch connected to the switch board;
   a plurality of pickups connected to the switch board, the plurality of pickups being configured to route a signal from the pickups;
   a dual value volume potentiometer connected to the switch board;
   a dual value tone potentiometer connected to the switch board; and
   an electronic touch capacitance selector switch connected to the switch board, wherein the electronic touch capacitance selector switch is configured, in combination with the selector switch, to change the condition of the switch board, thereby offering different combinations of pickups.

2. The musical instrument of claim 1 wherein the musical instrument comprises an electric guitar.

3. The musical instrument of claim 1 further comprising an output jack wired to the dual value volume potentiometer and the dual value tone potentiometer.

4. The musical instrument of claim 1 wherein the electronic touch capacitance selector switch comprises an LED touch capacitance selector switch that is illuminated when the electronic touch capacitance selector switch is activated.

5. The musical instrument of claim 1 further comprising an output jack, the output jack being connected to the switch board, the output jack receiving the signal routed from the pickups via the switch board.

6. The musical instrument of claim 1 wherein the electronic touch capacitance selector switch is configured to change from a first color to a second color.

* * * * *